United States Patent [19]

Knubley

[11] 4,333,491
[45] Jun. 8, 1982

[54] AIR DISPENSING APPARATUS

[76] Inventor: John S. Knubley, 1 Kia Ora, Barwis Hill, Penzance, Cornwall, England

[21] Appl. No.: 150,644

[22] Filed: May 16, 1980

[30] Foreign Application Priority Data

May 18, 1979 [GB] United Kingdom ................. 7917462
Oct. 16, 1979 [GB] United Kingdom ................. 7935858

[51] Int. Cl.³ ............................................. B60C 23/04
[52] U.S. Cl. ............................... 137/116.3; 73/146.8; 137/224; 137/227
[58] Field of Search .................... 73/146.8, 146.3, 146, 73/723–728, 708; 137/116.3, 224, 102, 227

[56] References Cited

U.S. PATENT DOCUMENTS

| | | | |
|---|---|---|---|
| 3,421,106 | 1/1969 | Garber et al. | 331/40 |
| 3,762,223 | 10/1973 | Feuer et al. | 73/724 |
| 3,908,460 | 9/1975 | Lichowsky | 73/723 |
| 4,089,058 | 5/1978 | Murdock | 364/571 |
| 4,115,767 | 9/1978 | Brosh | 340/347 CC |
| 4,192,005 | 3/1980 | Kurtz | 364/558 |
| 4,226,125 | 10/1980 | Waugh | 73/727 |
| 4,250,759 | 2/1981 | Vago et al. | 73/723 |
| 4,253,480 | 3/1981 | Kessel et al. | 137/102 |

FOREIGN PATENT DOCUMENTS

| | | |
|---|---|---|
| 1010849 | 6/1957 | Fed. Rep. of Germany . |
| 2041349 | 8/1970 | Fed. Rep. of Germany . |
| 1411386 | 8/1965 | France . |
| 2299979 | 3/1976 | France . |
| 2399668 | 2/1979 | France . |
| 2408825 | 8/1979 | France . |
| 1334846 | 10/1973 | United Kingdom . |

Primary Examiner—Donald O. Woodiel
Attorney, Agent, or Firm—Watson, Cole, Grindle & Watson

[57] ABSTRACT

A system for obtaining precise inflation to a desired pressure setting of pneumatic tires comprises a pressure transducer which provides an output voltage proportional to its input pressure determines the output frequency of a voltage/frequency converter. The output of the voltage/frequency converter is gated into a counter for a set period determined by a timer unit so that in such period the counter assembles a count which is a measure of the sensed pressure. The timer unit is adapted to divide down the local a.c. mains supply frequency so as to derive therefrom discrete timing pulses enabling cyclic operation of the apparatus within a predetermined timing framework. A user has the facility to enter a pressure target into the apparatus and, during each cyclic operation, a comparison is effected between the pressure sensed by the transducer and the set target pressure and, depending upon the outcome of this comparison, a pressure increment or decrement is affectuated as appropriate by operation of an inflate or exhaust valve. Compensation for transducer and/or voltage/frequency converter drift is described, together with variants such as for enabling extra large tires to be rapidly inflated.

16 Claims, 8 Drawing Figures

AIR DISPENSING APPARATUS

FIELD OF THE INVENTION

This invention relates generally to control systems of the kind in which a transducer is made responsive to fluctuations of a variable and corresponding control effort is made to affect the variable. More particularly, but not exclusively, the invention concerns improvements in tire inflation systems where the variable is pressure, the abovementioned transducer is pressure responsive and the control effort is directed towards inflation of a tire of an automobile, lorry or truck or other heavy road vehicle, or aircraft, to a desired pressure. In the following, the invention will be described with particular reference to tire inflation apparatus, but it is to be appreciated that the invention is not limited to such an application.

BACKGROUND OF THE INVENTION

Air dispensing apparatus, that is apparatus enabling the inflation of tires from a compressed air supply, is commonly provided at petrol stations, motor service stations, municipal bus garages etc. and it is well known that the inflation of tires to the correct pressure is a necessity for safety reasons and for fuel economy and for optimizing the life of the tires. Regrettably the apparatus hitherto available for this purpose has, in general, relied upon measurement of the tire air pressure by a simple mechanical pressure gauge, in some cases pre-set to a required pressure at which inflation is to be terminated and in other cases arranged merely to display to the user the pressure of air which has been introduced into the tire. It is found that while arrangements of this kind may be set up with reasonable accuracy upon first installation, the maintenance of appropriate accuracy during prolonged periods of use is a matter of great difficulty. Frequent recalibration of the pressure gauge mechanism would be required if such mechanical arrangements were to be expected to function accurately for long periods and unfortunately it is the case that such recalibration either is never effected or is effected only at such long intervals that substantial inaccuracies arise.

OBJECTS AND SUMMARY OF THE INVENTION

A principal object of the invention is the provision of an air dispensing apparatus which will enable the inflation of a vehicle tire to a desired pressure with a degree of accuracy and precision which previously has been unavailable using the commonly provided apparatus.

A more general object of the invention is to provide an improved control system utilizing a transducer to monitor a variable and effecting corresponding controls to affect the said variable in a predetermined manner.

Yet a further object of the invention is the provision of a precise pressure, or other variable, monitoring or measuring system.

These and other objects are achieved by means of an apparatus comprising a transducer device, sensitive for example to gas pressure, providing a control input to a voltage-to-frequency converter which provides a corresponding output signal the frequency of which is a measure of the state of the variable to which the transducer is exposed. The output of the frequency converter is gated, for a set time period, into a counter which thus assembles a count representative of the value of the variable. This count can be decoded and displayed, for example by means of seven-segment type LCD display elements, as a numerical representation, and/or can be employed for controlling the state of the variable. In the case where the apparatus is adapted for use for inflating tires, the apparatus is arranged such that the count assembled in the counter is compared with a set pressure entered by the user, and in dependence upon the results of this comparison the tire inflation is effected.

The apparatus according to the invention preferably operates cyclically under control of a central timing unit so that the state of the monitored variable is periodically sensed and the count effected as a measure of the variable correspondingly periodically updated. The timing unit conveniently makes use of the local a.c. mains frequency as its timing standard and divides this frequency down by means of a series of timing counters in order to obtain discrete timing signals of 1/10 second duration at intervals of 1/10 second and discrete timing signals of 1 second duration at intervals of 1 second. These timing signals are then employed in the control of the operation of the apparatus to determine the precise timings of the various functions which are undertaken in each operational cycle, and furthermore determine the cyclic operation of the apparatus.

In a first embodiment of the invention which is described hereinafter, an apparatus for inflating an automobile tire according to a desired pressure entry keyed in by a user, a pressure transducer exposed to the tire pressure yields a signal which determines the output frequency of an oscillator, the oscillator frequency is measured by means of a counter to which the oscillator output is applied for a predetermined time interval, the state of count of the counter is compared with signals representative of the desired tire pressure set into the apparatus by the user, and the inflation of the tire is effected to reduce the difference between the tire pressure as sensed by the transducer and the desired pressure set by the user. This operation is effected cyclically in five-second cycles during each of which there occurs a one-second period when an air supply valve is opened to supply compressed air to the tire, a two second rest period to allow the air pressure in the system to stabilize, and a one second measurement period when the transducer provides to the system a measure of the resultant tire pressure. The apparatus is furthermore arranged such that the tire is inflated in one-second bursts until the tire pressure is within a preset amount of the required pressure, and then the inflation period within each cycle is reduced so that the tire is thereafter periodically inflated in shorter bursts until the desired pressure is attained. Should the one-second inflation bursts take the tire pressure above its target pressure, then this is sensed and deflation of the tire is effected, again in short bursts, until the required pressure is achieved.

A second embodiment of the invention, also is described hereinafter. The system organization is different in that the tire is inflated in one-second bursts as with the first embodiment, but this is continued until the pressure in the tire is sensed as being greater than the desired pressure set by the user. The tire is then deflated towards the desired pressure, initially in one second bursts (which by virtue of the exhaust valve configuration result in a pressure decrement less in absolute terms than the pressure increment resulting from a one second inflation burst) and then, as the desired pressure is closely approached, in lesser bursts.

In both of the described embodiments provision is made for compensating for the variation in tire pressure which inevitably occurs after actuation of an air inlet or exhaust valve due to the response time of the valve and to the time required for the tire pressure to stabilize following an inflation or deflation burst.

The hereinafter described embodiments are susceptible to modification in various ways. For example their timing and logical functions could be achieved by means of a microprocessor. Described hereinafter, in addition to two exemplary embodiments of the invention, are a modified form of user entry system for enabling a user to enter his desired tire pressure, an auto-zero facility to compensate for any tendency for drift in the transducer and/or the voltage/frequency converter characteristics, a modification of the inflation cycle to accelerate the inflation of large tires or tires which are considerably under pressure, a modification of the deflation cycle in the second embodiment such that for each deflation step substantially the same pressure reduction is achieved regardless of whether the reduction is effected at different tire pressures, and various other modifications intended to extend the accuracy and the usefulness of application of the invention.

The invention, together with numerous objects, features and advantages thereof, will best be understood from consideration of the following detailed description of two embodiments thereof and of various modifications which can be made to these embodiments. The embodiments and some of the possible modifications are illustrated in the accompanying drawings.

DESCRIPTION OF THE DRAWINGS

The accompanying drawings illustrate first and second embodiments of the invention, taken by way of example only, which will be described in full detail in the following in order that the invention might be clearly appreciated and understood.

In the drawings.

DESCRIPTION OF THE FIRST EMBODIMENT

Figure 1:
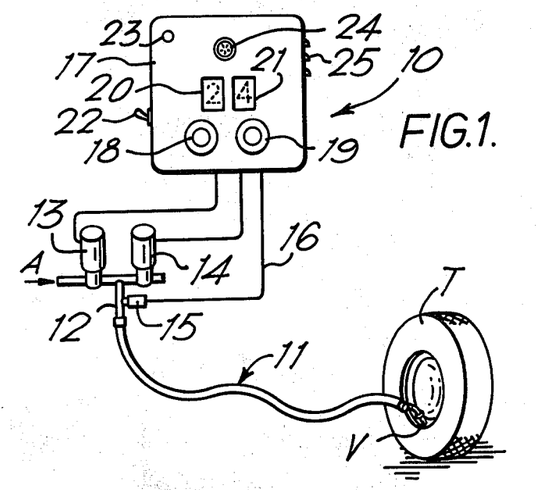
FIG. 1 is a diagrammatic representation of a first embodiment of air dispensing apparatus according to the invention.

The air dispensing apparatus 10 shown in FIG. 1 comprises an air supply hose 11 which is in known manner connected to the valve V of a tire T to be inflated. The other end of hose 11 is coupled to a T-pipe 12 leading to two electromagnetically operated valves 13 and 14. When energized, valve 13 connects hose 11 to a supply A of air at an appropriate pressure, while valve 14 allows air to escape from the hose. The pressure in T-pipe 12, and hence that in the tire, is measured by a pressure transducer 15 which is chosen to provide an appropriately high accuracy of response over a range of pressures up to 50 pounds per square inch (P.S.I.). The transducer employed is of a kind which provides an output voltage proportional to the measured pressure, such as for example a National Semiconductors LX 1730 BGZ pressure transducer. The signal from the transducer 15 is taken over a lead 16 to a control unit 17, containing circuitry to be described later in relation to FIGS. 2 and 3. Control unit 17 is provided with rotary controls 18 and 19 which enable the desired tire pressure to be set, control 18 determining the pressure in tens of P.S.I. and control 19 controlling the pressure in units of P.S.I. The values chosen by controls 18 and 19 are displayed in windows 20 and 21.

A remote switch 22 controls the whole apparatus and a pilot light 23 shows that power is available to operate the apparatus. When a desired pressure has been obtained a lamp 24 lights to give a visual signal and an audible signal is also given by a device within the unit 17, louvres 25 being provided to enable the signal to be clearly audible.

Figure 2:
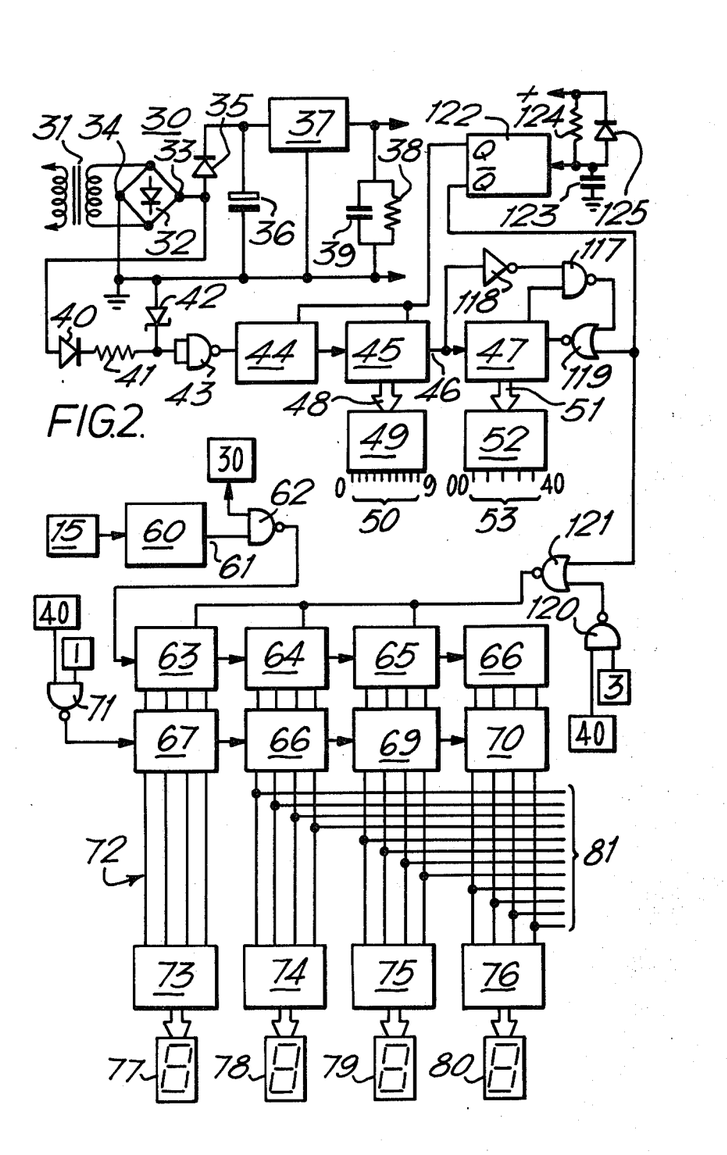
FIGS. 2 and 3 show the electrical circuit diagram of the first embodiment.
Figure 3:
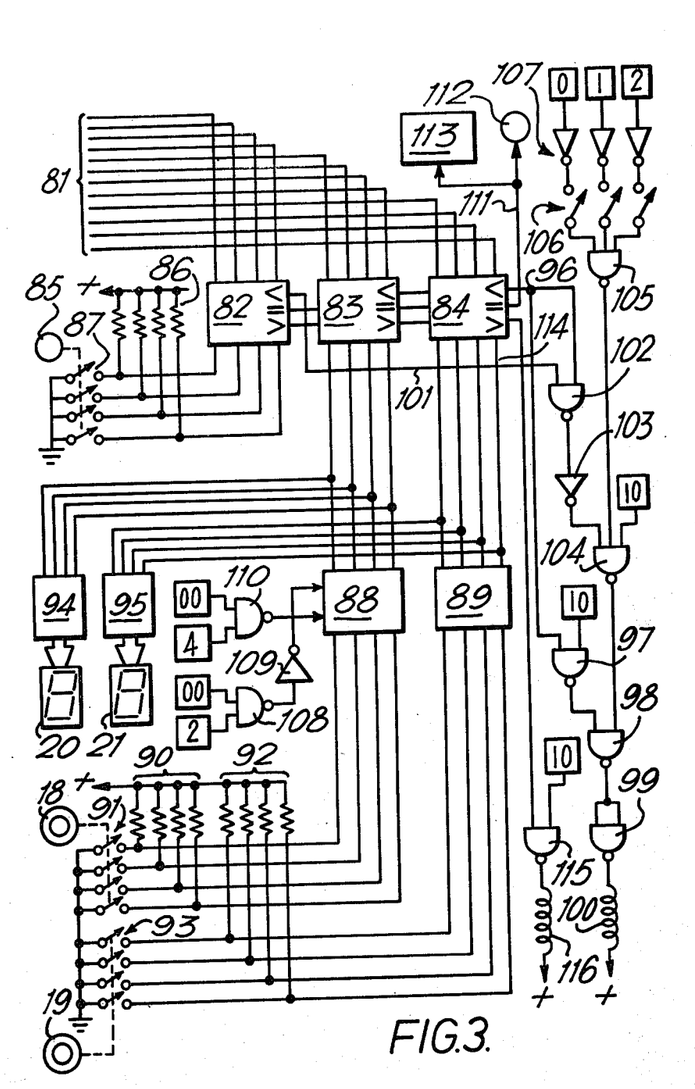

Reference should now be made to FIGS. 2 and 3 which show the circuitry employed to control valves 13 and 14 in accordance with the preset pressure determined by controls 18 and 19 and the actual air pressure measured by transducer 15.

The direct-current supply required to operate the electronic part of the apparatus is derived from the a.c. mains by a conventional rectifier circuit 30 including a transformer 31, the supply to the primary winding of which is controlled by switch 22 (FIG. 1). The secondary winding of transformer 31 supplies a bridge rectifier 32 which provides full-wave rectified a.c. at terminals 33 (+) and 34 (−). Terminal 33 is connected by way of an isolating diode 35 to a reservoir capacitor 36, and the supply is then stabilized by a known stabilizer 37 and fed by way of a shunt resistor/capacitor combination 38, 39 to the remainder of the electronic circuitry.

Positive-going half-wave voltage fluctuations, recurrent at 50 Hz when the a.c. supply has a frequency of 50 Hz, are applied by way of a further isolating diode 40 to the series combination of a resistor 41 and a Zener diode 42, across which latter there thus appear constant-amplitude voltage pulses which are applied to a trigger circuit 43 so that a 100 Hz pulse train is derived. This 100 Hz pulse train is applied to a first divide-by-ten frequency divider 44 that is arranged to yield an output which is repetitive every one-tenth of a second and these pulses are applied to the input of a second divide-by-ten divider 45 which provides output pulses every second at 46 to drive a third divide-by-five divider 47. Divider 45 also provides coded outputs by way of connections 48 to drive a decoder 49 providing at 50 ten output signals occurring at one-tenth second intervals, and each persisting for one-tenth second; that is to say, the output at terminal "0" persists from 0.00 through 0.09 second, that at terminal "1" from 0.1 through 0.19 second, and so on. In a similar manner, divider 47 is arranged to provide by way of connections 51 to a decoder 52 signals which are used to provide at 53 five outputs each persisting for one second; that is to say, the signal at output "00" persists from 0.0 through 0.9 seconds, the signal at output "10" from 1.0 through 1.9 seconds, and so on. The timing signals thus made available at outputs 50 and 53 of decoders 49 and 52 are used to control the operating sequence of the remaining apparatus, as will appear as the description proceeds.

It will be appreciated that for use in situations where the a.c. supply frequency is other than 50 Hz and the pulse repetition frequency at the input to frequency-divider 44 is correspondingly different, a different divide-by ratio for the divider 44 will be required in order that it provide an appropriate input to the second frequency-divider 45.

The output voltage of pressure transducer 15 is applied to control a voltage/frequency converter 60 of known kind yielding at 61 an output signal of which the frequency varies with pressure over the range 0–5 kHz as the pressure rises from 0–50 P.S.I. This signal is applied to one input of a NAND gate 62, the second input of which receives an enabling signal from output "30" of decoder 52 so that the gate is opened for one second during the cycle counting interval "30–39". The output signal of gate 62, that is the output of voltage/frequency converter 60 during the one second period abovementioned, is applied to a four-stage binary decimal counter, comprising stages 63, 64, 65 and 66 connected in sequence, which assembles a count of the number of excursions of the output of voltage/frequency converter 60 in the one second gate period. Each counter stage has its outputs taken to a respective latch 67, 68, 69 and 70, the operation of which is controlled by a NAND gate 71 fed with signals from output "40" of decoder 52 and from output "1" of decoder 49, so that the gate yields an output signal at time "41" of the timing cycle.

The outputs of latches 67–70, representing the count reached by counter stages 63–66 during the one second interval at time "30–39" of the timing cycle, are applied by way of output lines 72 to respective decoders 73, 74, 75 and 76 which each control an individual 7-segment display 77, 78, 79 and 80. Thus the count reached by counter stages 63–66 in any one cycle of operation is held available by latches 67–70 until the next counting cycle has been completed and is also displayed, for calibration purposes, or for use of the apparatus as a highly sensitive and precise pressure meter, on the displays 77–80. The outputs from latches 68–70, representing the air pressure in units of 1/10, 1 and 10 P.S.I. are fed out by way of lines 81 to the circuitry shown in FIG. 3.

The output lines 81 from latches 68, 69 and 70 are applied to one set of inputs of respective comparators 82, 83, 84. The other set of inputs of comparator 82, to which the signals from latch 68 are applied, receive signals that are controlled by a preset switch 85 used to determine a value of pressure in the range 0.1 to 0.9 P.S.I. that is used to compensate for over-run of the pressure due to the finite operating time of the control valves as will be explained hereinafter. Each of the second inputs of comparator 82 is taken to the positive supply line by way of a respective one of resistors 86 and appropriate inputs are earthed at each setting of switch 85 by cam-actuated switch contacts 87. The second inputs of the comparators 83 and 84 receive signals from respective settable counter stages 88 and 89, each of which is arranged to be set to a required value representative of a desired or target pressure by means of the respective one of rotary controls 18 and 19. To this end each of the respective inputs of counter stage 88 can selectively be connected either to the positive supply line by way of one of resistors 90 or to earth by appropriate setting of cam-actuated contacts 91 of switch 18, and similarly the inputs of counter stage 89 can selectively each be connected either to the positive supply line by way of one of resistors 92 or to earth by appropriate setting of cam-actuated contacts 93 of switch 19.

The outputs of counter stages 88, 89 are paralleled with the inputs of respective decoders 94, 95, controlling the 7-segment displays 20 and 21 respectively, thus enabling the set tire pressure to be read off the displays.

The air supply should be cut off immediately the tire pressure becomes equal to or just exceeds the value selected by the user's operation of switches 18, 19. To allow for any excess pressure due to the finite time that the valve takes to operate, it is desirable to ensure that the cut-off condition is initiated before the actual set value is attained. This is achieved as follows.

At time "02" the actual value set by the actuation of switches 18 and 19 is entered into counter stages 88 and 89 in response to a signal developed by a NAND gate 108 to which are applied signals from the "2" and "00" timing outputs of decoders 49 and 52 respectively and the output signal of which is fed by way of an inverter 109 to the "enter" control input of counter stages 88 and 89. At time "04" a signal developed by a NAND gate 110 which receives the "4" and "00" timing signals from decoders 49 and 52 is applied to decrement counter stage 88 by one count, thus reducing the set value by 1 P.S.I. The actual over-run pressure is usually less than 1 P.S.I. and a compensation value selected from the range of 0.1 to 0.9 P.S.I. is introduced by the signals applied from preset switch 85 to tenths-of-pounds comparator 82, thus allowing an over-run pressure of from 0.1 to 0.9 P.S.I. to be compensated.

If the pressure as measured by transducer 15 is less than the decremented value entered into counters 88, 89, then an under-pressure output line 96 common to comparator stages 83 and 84 will apply a signal to NAND gate 97. NAND gate 97 receives an enabling signal from terminal "10" of divider 52 during clock interval "10–19" so that during this one-second interval a corresponding output signal from gate 97 can be applied by way of a NAND gate 98 and a driver stage 99 to energize the operating winding 100 of a relay that controls air valve 13, a contact of the relay applying a.c. to the valve actuating solenoid, so that air valve 13 is opened to admit air to the tire.

When, as a result of the supply of air thus provided, the sensed pressure in the tire, as recorded in the pounds and tens-of-pounds latches 69 and 70 respectively, rises above the pressure recorded in counters 88 and 89, then the signal on line 96 will cease. In subsequent cycles the air valve 13 will be operated to inflate the tire still further only by virtue of the comparison effected by comparator unit 82 between the output of tenths-of-pounds latch 68 and the setting of pressure over-run compensator switch 85. So long as this comparison indicates a sensed pressure component in latch 68 lower than the setting of switch 85, there will be produced on line 101 a signal that is fed through a NAND gate 102 and an inverter 103 to a further NAND gate 104. This latter gate receives a first enabling signal from output "10" of decoder 52 and a second enabling signal from a NAND gate 105, to which signals are applied by way of switches 106 and inverters 107 from any one or more of outputs "0", "1" and "2" of decoder 49. Thus gate 104 is enabled to pass the signal from line 101 during clock interval "10–12" if all three of switches 106 are closed, or for a lesser period, as is found suitable. The signal from gate 104 is fed through NAND gate 98 to actuate air valve 13 as described above. As will be appreciated, actuation of the air valve 13 in this mode occurs in much lesser periods than in the normal inflation mode.

When the pressure measured by transducer 15 is found by comparators 82, 83, 84 to be equal to the values set by switch 85 and entered into counters 88 and 89 a signal is developed on line 111 and is applied to a visual signal device 112 and to an apparatus 113 arranged to yield an audible signal.

If the pressure measured by transducer 15 is in excess of that which is required, then comparators 82-84 yield a signal on line 114 which is fed through a NAND gate enabled by the timing signal from output "10" of decoder 52 and energizes a relay 116, of which the contact supplies power to the air-release valve 14, which is thus opened for one second during each operating cycle until an appropriate pressure reduction has been made.

Resetting of the timing and measuring counters is effected as follows. When clock counter stage 47 reaches a count of four seconds, an enabling signal is applied from the counter to a NAND gate 117 so that the next input signal applied to that counter stage is fed through inverter 118 to gate 117 and thence by way of a NAND gate 119 to the reset input of counter 47 establishing the required divide-by-five action for this stage.

The measuring counter stages 63-66 are reset at a clock count of "43" by a signal developed by a NAND gate 120 fed with the clock signals "40" and "3" and fed to the reset inputs of each of the four counter stages by way of a NAND gate 121. A signal developed at the $\bar{Q}$ output of a trigger 122, responsive to a predetermined increase in potential across a capacitor 123 which is charged from the positive supply by way of a resistor 124 is applied to each of NAND gates 119 and 121 to effect resetting of stages 47 and 63-66. This monostable trigger will produce a switch-on reset pulse when the positive supply is first applied after a time delay determined by resistor 124 and capacitor 123. Diode 125 is included to discharge capacitor 123 when the power supply is turned off. The signal from the Q output of trigger 122 is applied to reset timer stages 44 and 45.

Briefly therefore, in operation of the system thus described, a user selects the desired air pressure, connects his tire and actuates the air trigger. The system then enters a sequence of 5 second cycles during which, initially for one second, the air control valve is opened to inflate the tire. The tire pressure is measured during the "off" period of the cycle and is compared to the required value. When the measured value is within a set amount of the required value, the "on" period is reduced and comparison of pressures continues until substantial equality of the sensed pressure and the required pressure occurs when further opening of the air valve is inhibited and visible and audible indications are given. Should the one-second inflation periods take the sensed pressure above the required pressure, then an air relief valve having a smaller orifice than the inlet valve is opened for one second per cycle until equality is reached. As will be appreciated, should the required pressure be altered, the system will automatically follow the new setting.

To take account of the finite time taken for the valves to operate, it is desirable to generate the cut-off signal which inhibits further inflation of the tire before the required pressure is actually reached. This is effected by decrementing the customer's required pressure setting and introducing a preset compensation factor. The inflation cycle proceeds normally until the customer's decremented target pressure is exceeded, and the system then reduces the inflation time per cycle and brings the tire up to pressure under control of the preset compensation factor.

DESCRIPTION OF THE SECOND EMBODIMENT

A second embodiment of the invention will now be described with reference to FIGS. 4, 5 and 6 of the accompanying drawings. This second embodiment is a modified and improved form of the first embodiment described in the foregoing which enables the desired pressure of air in an inflated vehicle tire to be obtained with even greater accuracy. The basic operation of the second embodiment is similar to that of the first embodiment in that a pressure transducer exposed to the tire air pressure yields a signal that is applied to control the output frequency of an oscillator, so that the oscillator frequency represents a measure of the air pressure, the oscillator output frequency is measured to obtain a pressure-denotive set of signals by means of a counter to which the oscillator output is applied for a predetermined time-interval, signals representing the state of count of the counter are compared with other signals representing the desired tire pressure, and means are provided to ensure that the actual tire pressure is brought to close equality with the desired or set pressure. However, whereas in the first embodiment compensation for over-run resulting from the finite time taken for the valves to operate was effected by generating a target pressure lower than the pressure set by the user by a predetermined amount and aiming to inflate the tire to the lower target pressure, the over-run then bringing the target pressure attained up to close equality with the pressure set by the user, in the second embodiment the arrangement is such that the tire is inflated to above the pressure desired by the user and is then deflated in precisely controlled steps until the required pressure is attained. Various other differences also will become apparent as the description proceeds.

Figure 4:
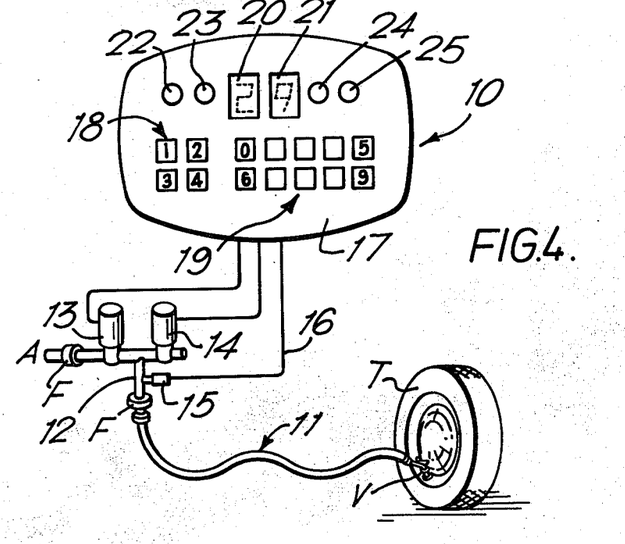
FIG. 4 is a diagrammatic representation of a second embodiment of air dispensing apparatus according to the invention.

Referring first to FIG. 4, which is similar to FIG. 1 and uses the same reference numerals for like parts, the air dispensing apparatus 10 shown in the figure comprises an air supply hose 11 which is in known manner connected to the valve V of a tire T to be inflated. The other end of hose 11 is coupled to a T-pipe 12 leading to two electromagnetically operated valves 13 and 14. When energized, valve 13 connects hose 11 to a supply A of air at an appropriate pressure, while valve 14 allows air to escape from the hose. The pressure in T-pipe 12, and hence that in the tire, is measured by a pressure transducer 15 which is chosen to provide an appropriately high accuracy of response over a range of pressures for example up to 50 pounds per square inch (P.S.I.). The transducer employed is of a kind which provides an output voltage proportional to the measured pressure such as the National Semiconductor LX 1730 BGZ device aforementioned. Filters F are preferably provided to prevent dust from the tire or the compressor reaching the valves or the transducer. The signal from the transducer 15 is taken over a lead 16 to a control unit 17, containing circuitry to be described later in relation to FIGS. 5 and 6. Control unit 17 is provided with sets of touch-actuated switches 18 and 19 which enable the desired tire pressure to be set, switches 18 determining the pressure in tens of P.S.I. and switches 19 controlling the pressure in units of P.S.I. The values chosen by switches 18 and 19 are displayed in windows 20 and 21. Internal indicator lamps 22, 23, 24 and 25 provide information as to the state of operation of the apparatus thereby facilitating repair and servicing of the apparatus. When a desired pressure has been obtained a lamp 24 lights to give a visual signal and an audible signal is also given by a device within the unit 17, louvres being preferably provided to enable the signal to be clearly audible.

Figure 5:
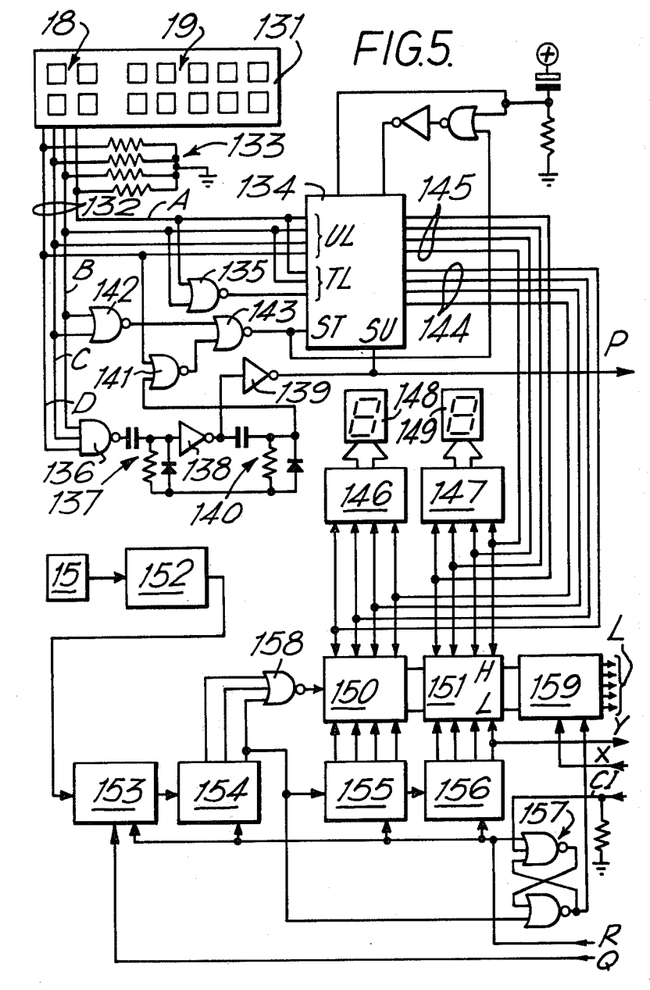
FIGS. 5 and 6 show the electrical circuit diagram of the second embodiment.
Figure 6:
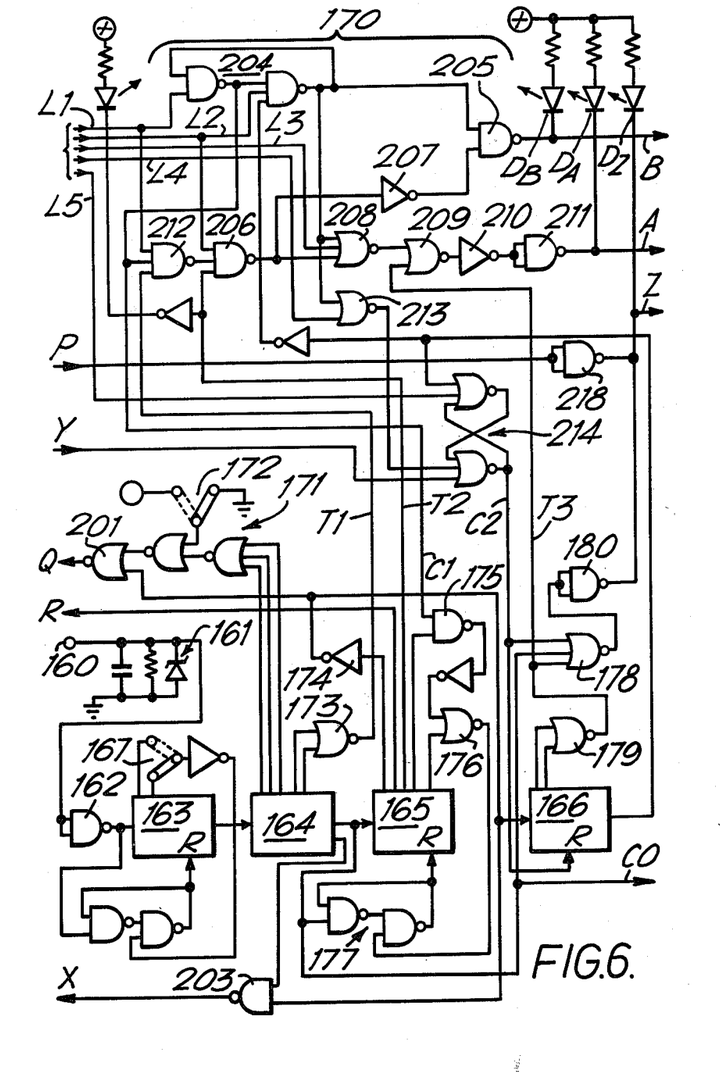

Reference should now be made to FIGS. 5 and 6 which show the circuitry employed to control valves 13 and 14 in accordance with the preset pressure determined by switches 18 and 19 and the actual air pressure measured by transducer 15.

The pressure to which the tire is to be inflated is set up by the user by means of commercially available touch switches contained in a switch unit 131. This unit contains four "tens" switches 118, designated "10", "20", "30" and "40" and ten "units" switches 119 disposed in two rows, those of the upper row being designated "0" to "4" and those of the lower row being designated "5" to "9". Each touch switch comprises an isolated metal tap which when touched by the operator's finger prevents the passage of a signal from a source common to all the switches to actuate a respective detector circuit. When a detector circuit is thus de-activated, it actuates a respective unique combination of trigger circuits which apply positive signals to one or more of output lines 132, thus denoting the designated digit in standard binary-coded-decimal (BCD) code. Output lines 132 are returned to earth through respective individual resistors 133 and pass to a dual latch unit 134 containing two sets of latches, one to hold the units digit and the other to hold the tens digit. Actuation of the latch unit to store the respective code signals is effected as follows.

The four output lines 132 of switch unit 131 will be designated A, B, C and D, according as the binary signal which each carries represents the decimal value "1", "2", "4" or "8". The four lines A–D are connected to the corresponding units latch inputs UL of latch unit 134. Lines A and B are also applied directly to the corresponding tens latch input TL. For reasons described below, the remaining lines C and D are not connected to the "4" and "8" tens latch inputs; instead tens latch input "8" is fed from the output of a NOR gate 135, to the inputs of which are connected lines A and B. Gate 135 thus yields a positive output signal only in the absence of any signal on line A or B.

Signals applied to the units latch inputs UL are entered in the latches only when a respective strobe input ST is fed with a positive signal. Appropriate energisation of these strobe inputs is effected under the control of logic circuitry which will now be described.

Signals lines B, C and D are taken to respective inputs of a NAND gate 136, which yields a positive-going signal when any one or more of these lines carries a signal. The output of gate 136 is applied to a shaping circuit 137, comprising a series capacitor and a shunt parallel combination of a resistor and an inverted diode. In response to the end of any signal on lines B, C, D, circuit 137 yields a long, negative-going pulse which is inverted by an inverter 138 and fed out by way of a further inverter 139 to provide a "unit strobe" signal that is applied to the "Strobe Units" input SU of latch unit 134. This signal is also fed out by way of a line P to energize a sound signal by circuits shown in FIG. 6.

The output of inverter 138 is also applied to a further shaping circuit 140, identical with circuit 137, the long pulse output of which is fed to one input of a NOR gate 141, which is inhibited by any signal on Line D. To prevent a "Tens strobe" operation in response to selection of either of unit digits 8 or 9, lines B and C are taken to a NOR gate 142, a positive output from which inhibits a further NOR gate 143, through which the output of gate 141 is fed to the "Strobe Tens" input ST of latch unit 134. Thus if unit digit 8 or 9 has been selected, a strobe signal will not be applied to the "strobe tens" input ST of latch unit 134 but if any "tens" switch has been touched, the appropriate strobe signal will be applied to the latch unit.

In this manner the two sets of latch circuits in latch unit 134 will be set up to hold the appropriate binary coded representations of the selected tens and units representing the desired tire pressure. These signals are fed out over respective sets of output lines 144 and 145 to appropriate code converters 146 and 147, each of which converts the input binary code signal into the signals necessary to display the respective digit on two 7-segment display devices 148 and 149, the device 148 displaying "tens" and the device 149 displaying "units". The signals on lines 144, 145 are also applied to respective comparator units 150 and 151, which are arranged as described below to receive signals representing the measured air pressure in the tire.

As in the previously described embodiment, the pressure transducer 15 yields a voltage representative of the actual tire pressure to a voltage/frequency converter 152, which includes a voltage-controlled oscillator the output frequency of which varies in accordance with the pressure sensed by transducer 15. This pressure-representative output signal is applied to a counter train comprising four counter stages 153, 154, 155 and 156 for a predetermined period controlled by timing circuits to be described later, so that the state of count of the counter at the end of the predetermined period is a measure of the pressure sensed by the transducer 15. The four counter stages 153 to 156 are reset at the end of the predetermined period by a signal received over a line R from the circuitry shown in FIG. 6 and described later. In addition, counter stage 153 receives from the circuitry of FIG. 6 over a line Q a signal which is arranged to modify the scaling factor of the counter chain when the unit of pressure measurement is chosen to be kg/cm$^2$ rather than pounds per square inch; a corresponding adjustment of the apparatus for use in terms of kg/cm$^2$ rather than p.s.i. could clearly be made in the circuitry associated with the input panel 131.

A bistable circuit 157 formed by two NOR gates is arranged to be set by an output of the second counter stage 154 and then yields a signal that is applied to an input of a latch "A" contained in a clocked quad latch unit 159 the function of which will be made clear as this description proceeds. The signal applied to the bistable circuit 157 denotes that at least a minimum pressure is present in the system which indicates that a tire is connected to the apparatus, and in response to this the latch unit 159 provides an output which signifies that inflation may proceed. The use made of this signal is described more fully in the following.

The timing signals used to control the cyclic operation of the apparatus are derived similarly to the manner in which they are derived in the first embodiment, that is to say a mains-frequency voltage, which may be of either 50 Hz or 60 Hz, is received at an input terminal 160 whence it is applied to a circuit 161 comprising the parallel combination of a capacitor, a resistor and a Zener diode. The pulse signal thus developed is applied by way of a Schmitt trigger circuit 162 to the input of a four-stage frequency divider comprising decimal frequency divider units 163, 164, 165 and 166. The scaling factor of first divider stage 163 is selected to be appropriate to the mains frequency by means of a link 167 so that an output signal appears every 1/10 second from divider stage 163 and is applied to the input of the second divider stage 164, which provides an output repetitive every second to the third divider stage 165. An output from third divider stage 165 is supplied via an inverter 74 to a clock input of the fourth divider stage 166. The functions of the various other outputs of the divider stages which are shown in FIG. 5 will become clear from the following, and it is now only to be noted that outputs are taken from divider stage 164 and applied to a circuit generally designated 171 and including a switch 172. In dependence upon the setting of switch 172, the apparatus functions either in pounds per square inch or in kilograms per square centimeter.

The signals 144 and 145 representative of the pressure set by the user in the touch switch control unit 131 are supplied as one series of inputs to comparators 150 and 151 which take a second series of inputs from counters 155 and 156, these second inputs being representative of the pressure sensed by the transducer 15. The comparators 150, 151 compare the set pressure with the sensed pressure and provide respective "high" and "low" outputs H and L to quad latch unit 159 in dependence upon whether the sensed pressure is higher or lower, respectively, than the set pressure. A NOR gate 158 takes inputs from preselected outputs of the tenths-of-pounds per square inch counter stage 154 and provides a control signal to comparator 150 when any of these preselected outputs are enabled; by this means the comparators, in effect, anticipate the occurrence of the relationship between their compared inputs and thereby compensate for over-run of the pressure due to the response times of the pressure control valves.

The "high" and "low" outputs, "H" and "L", of comparators 150, 151 are fed to respective latches "D" and "B" in the clocked quad latch unit 159. The latch unit 159 provides five outputs on lines L1 to L5 and these serve, as shown in FIG. 6, as control inputs to logic circuitry generally designated 170 which controls the pressure adjustment cycle. Latch A yields an inverse output on line L1, latch B yields both a direct signal and an inverted signal over lines L3 and L4 respectively, while latch A, mentioned previously herein, yields direct and inverted signals over lines L2 and L5 respectively. A signal from the last stage 156 of the pressure counter 153, 154, 155, 156 is also fed over a line Y to the logic circuitry 170 which also receives timing signals, derived from the timing counter stages 64, 65 and 66, over lines T1, T2 and T3. The logic circuitry 70 in response to its various inputs provides control signals over lines C1 and C2 to affect the operation of the timing circuits, and over lines A, B and Z provides signals which respectively open the pressure relief valve 14, open the air supply valve 13 and energize an alarm device. Light-emissive diodes $D_A$, $D_B$ and $D_Z$ indicate the energization of the respective one of these three lines.

As shown, the logic circuitry 170 includes a number of NAND gates such as gate 206, NOR gates such as gate 208, and inverter stages such as inverter 207, all of which are indicated in FIG. 6 by conventional graphic symbols. The detailed connections of these circuit elements can be seen from FIG. 6 and need not be described in detail here. The functions of the various circuit elements will, it is believed, be clear from the following description of the operation of the apparatus. The overall system operation will first be briefly described, and then a detailed description will be given.

Briefly, therefore, the apparatus described operates as follows. When a tire is connected to the apparatus and is proven to provide at least a minimum pressure at the transducer 15, the initial operation proceeds in a series of 4-second cycles. During the first second of each cycle, valve 13 is opened to admit air to the tire; during the second and third seconds no action is taken, so as to allow an equilibrium condition to be attained; and during the fourth second of the cycle a pressure measurement is made. This cycle is repeated until the result of the measurement, represented by the outputs from counter stages 155 and 156, is found by comparators 150, 151 to exceed the desired pressure selected by means of switches 18, 19. A two-second dwell period then occurs in response to a signal from gate 179 in order to permit the system pressure to stabilize. This is followed by a series of 3-second pressure reduction cycles. During the first second of each of these cycles valve 15 is opened to allow a small amount of air to escape from the tire, then follows a 1-second 'rest' interval, followed by a 1-second measurement period. When the measured pressure as assessed by the comparators 150, 151, is found not to exceed the set pressure but yet is not less than the set pressure, then the valve 15 is opened cyclically for a very short period until the comparators sense exact equality of actual and set pressures. When this condition is found an alarm signal is given as each 4-second cycle is repeated. This occurs twice only, and is then followed by 3-second letdown cycles and a return to the inflation procedure. Output line CO provides a 1-second timing pulse that may be used to control an operational period for the apparatus as determined by a coin-actuated timer which may optionally be provided. In this case, when the allowed time has expired, an inhibit signal is fed in by the timer on line CI.

Having thus briefly explained how the apparatus of FIGS. 4, 5 and 6 operates, the operation of the apparatus will now be described in detail.

The timing cycle of the apparatus is derived from the a.c. supply frequency through pulse shaping circuitry 161 and Schmitt trigger 162 which feed pulses to divider 163 such that a 1/10 second pulse train appears at the divider output. Following divider stage 164 provides one second pulses to divider stage 165 and the two divider stages 164, 165 provide coded outputs representative respectively of tenths of seconds and seconds for controlling the timing of the entire system. Decade counter stage 166 is reset to zero every four seconds by means of the connections of NOR gate 176 and bistable latch circuit 177. These components are the basis for derivation of timing periods of 0, 1, 2, 3 and 4 seconds and of 0 to 9 in 1/10 second intervals, and this timing system operates continuously so long as the apparatus is in use.

In the static (rest) condition of the apparatus when no tire is connected but the circuits of the apparatus are energized, the pressure transducer 15 will feed a nominal 2.5 volts signal to the voltage/frequency converter 152. The voltage/frequency converter is arranged to provide a zero frequency output at the nominal 2.5 volts input from the transducer, and to provide other output frequencies proportional to the input pressure. The output of the voltage/frequency converter 152 is coupled to counters 153 to 156. The input to the tenths-of-seconds counter stage 154 is arranged so as to be enabled for 1/10 second at a time in each cycle of 0.8 seconds from the start of the cycle as determined from appropriate outputs of counters 164 and 165 gated through NOR gate 201, and during this 1/10 second period the counters can count any input from the voltage/frequency converter 152. In the rest condition, no output is provided from counter 154 to latch circuit 157, which is indicative that the pressure at the transducer 15 is less than a set pressure established according to the output of counter 154 connected to latch 157, and latch 157 thus remains in a reset condition in which it applies a reset input to the "A" latch of quad latch unit 159. The resultant condition on the outputs of the "A" latch inhibits, via the logic circuitry 170, the opening of either of the air inlet and exhaust valves; thus, with pressures below a set pressure at transducer 15, no action will be taken by the apparatus to open the air inlet valve and wasteful operation of the apparatus with no tire connected is precluded.

The selection of a desired pressure by a user is effected by means of the touch switch assembly 131 and associated circuits as previously described. The pressure set by the user is retained by the dual quad latch unit 134 which sets up corresponding BCD outputs which are fed to decoder drivers 146, 147 for energizing displays 148, 149 and are also fed to inputs of the comparators 150 and 151. Each time the user touches a touch switch in the assembly 131, an output is provided via inverter 139 and driver 218 to energize an audible "bleep" alarm.

The user having set his required pressure by appropriate operation of touch switch assembly 131 and having connected his tire to the apparatus, at a cycle time of 2.0 seconds as determined by divider stage 165 a signal is fed from divider 165 to the reset inputs of the counters 153 to 156 and to the reset input of latch 157. The main counters 153 to 156 are thus cleared. At a subsequent cycle time of 0.8 seconds, determined by outputs from the zero second port of divider stage 165 and from the eight-tenths port of divider stage 164, the counters are enabled for 1/10 second and assemble a count proportional to the pressure of the tire as sensed by transducer 15. During this period, and assuming the tire has a pressure higher than the predetermined inhibiting minimum, an output from counter 154 will set latch 157 which in turn will provide an enabling input to latch "A" of quad latch unit 159.

The count held in counter stages 155 and 156 is then compared with the BCD output of dual quad latch 134 by means of comparators 150 and 151 and of gate 158. The outputs of comparator 151 feeds signals to quad latch 159 which are indicative of whether the sensed pressure is higher or lower than the selected pressure. At a cycle time of 0.9 seconds, a latch enable input of quad latch 159 is enabled by a signal on line X derived by NAND gate 203, and the latch 159 then has inputs representative of the fact that the sensed pressure is greater than a set minimum and is higher or lower than the required pressure. Assuming that the sensed pressure is lower than the required pressure, two signals are then fed from quad latch 159 (one indicative that the pressure is above the set minimum, and the other indicative that the pressure is not greater than the required pressure) to latch 204 which sets latch 204 and provides an enable signal to NAND gate 205. A timing signal is fed at a cycle time of 1.0 seconds from counter 165 via gate 206 and inverter 207 to the second input of gate 205, and in response to these two inputs gate 205 provides an output to enable a solid state relay B to open the air inlet valve 13. The relay B is energized for one second corresponding to the duration of the enabling input to gate 206 from counter 165.

This cycle then repeats and inflation of the tire is effected in one-second bursts, each of which is arranged to increase the tire pressure by, say, 2 p.s.i., until such a time as the comparators 150, 151 latch an output into quad latch 159 such as to indicate that the sensed pressure is greater than the required pressure. In practice, the apparatus is set up such that this indication is not provided until the sensed pressure exceeds the required pressure by a predetermined amount, such as, say, 1 p.s.i. Latch 204 is then reset by an output of quad latch 159 and, via gate 205, this inhibits further inflation of the tire. At the same time, gate 208 in the "deflate" valve control circuit is enabled.

There then follows a deflation operation which occurs in two stages, namely a first stage in which the pressure is cyclically released until the "sensed pressure greater than set pressure" output of the comparators 150, 151 is no longer present but the "sensed pressure lower than set pressure" output has not yet appeared, and a second stage in which the pressure is cyclically released in smaller steps until the "sensed pressure lower than set pressure" output occurs whereupon deflation ceases.

Considering the first stage of the deflation, we enter this stage with NAND gate 205 disabled and NOR gate 208 enabled. The timing input to gate 208 for the deflate cycle, as on inflation, is fed from NAND gate 206 which is itself enabled by the one-second port of timer 165. The output of gate 208 feeds via NOR gate 209, inverter 210 and driver 211 to energize a solid state relay A which opens the exhaust valve for the duration of the one second output from timer 165. This first stage is then repeated, effectively reducing the tire pressure in one second steps until the sensed pressure is no longer greater than the set pressure.

The system then enters the second stage of deflation. This is effected under control of respective outputs of divider stage 164 applied through NOR gate 73 and NAND gate 212 to enable NAND gate 206 only for periods of 0.2 second. The effect of this is that the exhaust valve opening time is modified and the system cycles at this reduced exhaust valve open time until the comparators 150, 151 provide to the quad latch 159 an output indicative that the sensed pressure is less than the desired pressure. NAND gate 158, which is fed from selected ones of the ports of the tenths-of-pounds per square inch counter stage 154, provides an input to comparator 150 such as to compensate for the pressure difference between the pressure set by the user and the "less than set pressure" condition detected by the comparators and thereby enable the termination of the operation within a working tolerance, better, for example, than 0.1 p.s.i., of the set pressure.

Having achieved the desired pressure, outputs from quad latch 159 and latch 204 are applied to NOR gate 213 and produce therefrom an output which sets latch circuit 214. When latch 214 is set, a set input is provided to divider stage 166 which removes its reset condition. Clock inputs are provided to divider 166 from the zero output of one-second divider stage 165 via inverter 174.

At times "0" and "1" in divider 166, outputs are fed via NOR gates 179 and 178 to driver 180 for operating the audible alarm over line Z. At the expiry of times "0" and "1" of timer 166 and during each of times "2", "3" and "4" (decoded as the inverses of the "0" and "1" times by gate 179) one second duration deflate pulses are fed via gate 179, NOR gate 209, inverter 210 and driver 211 to the exhaust valve control relay A. At time "5" of timer 166, an output is provided to reset latch 214 and establish a permanent reset on counter 166. If the user disconnects the tire from the apparatus during the two seconds period when the audible alarm is sounded, then the pressure counter stage 154 senses a pressure lower than the predetermined minimum and provides an output via latch 157 and quad latch 159 to reset latch 214 and establish the permanent reset on counter 166, but if the tire is not disconnected during the period of sounding of the alarm then the tire will receive three one-second deflations after which the inflation cycle will recommence under control of the pressure transducer 15.

DESCRIPTION OF MODIFICATIONS AND VARIATIONS

Having thus provided detailed descriptions and explanations pertaining to two exemplary embodiments of the invention, there will hereinafter be described a number of variations or modifications which can be made without departure from the spirit and scope of the invention. It is to be appreciated that many and varied modifications and alterations will become apparent to those in possession of appropriate skills from a reading of the foregoing descriptions, and those which are described in the following are but examples.

Figure 7:
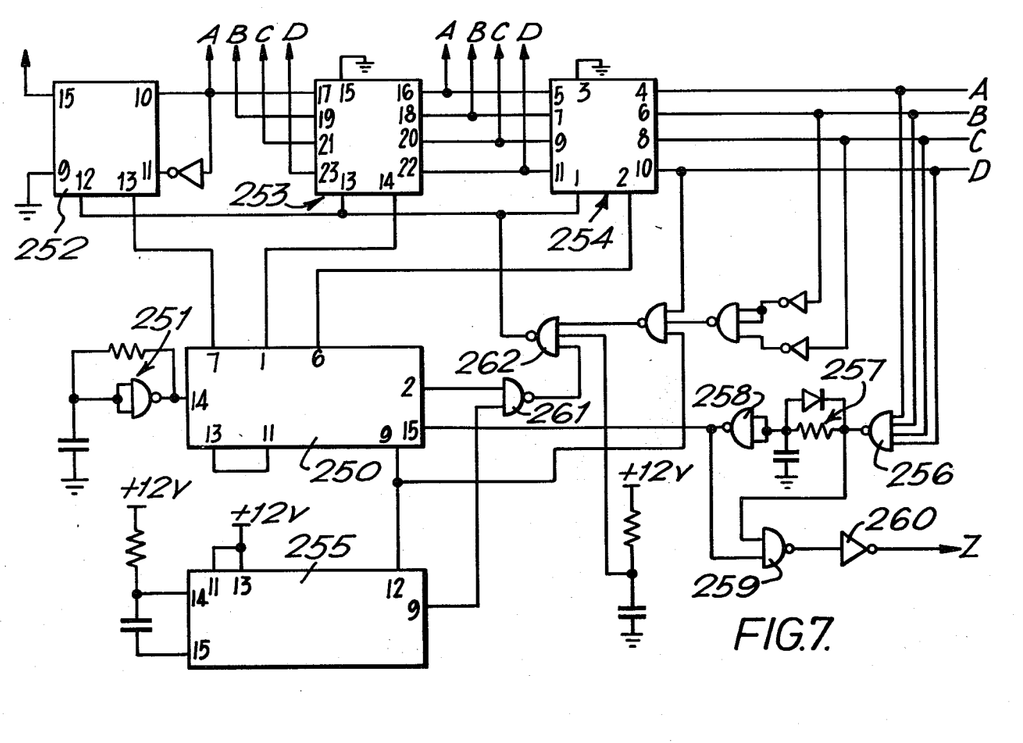
FIG. 7 shows the electrical circuit diagram of a modified form of input arrangement for use in keying in the required pressure setting.

Referring to FIG. 7 of the accompanying drawings, there is shown therein an alternative form of entry system for enabling a user to record in the system his desired pressure. The embodiments hereinbefore described have been suitable particularly for inflation of automobile tires and tires of a similar size, but the system according to the invention could just as well be used for inflating heavy lorry tires or aircraft tires where the desired pressure might exceed one hundred pounds per square inch; for such high pressure applications, the entry systems of the described embodiments might prove to be restrictive. The entry system of FIG. 7 is a keyboard system, similar to that of an electronic calculator for example, which assembles a numerical entry according to serial application of selected keys of a 10-key keyboard in which each key is representative of one of the numerals 0 to 9. Inputs coded in BCD are provided from the keyboard on lines A, B, C, D. The system shown comprises a counter 250 which takes clock inputs from a clock generator circuit 251 and provides outputs inter alia to hundreds, tens and units latches 252, 253 and 254 respectively. The hundreds latch 252 has but a single output since the system shown is not expected to have to accommodate pressures exceeding 199 p.s.i., but the tens and units latches 253 and 254 provide BCD outputs, the outputs of the latches being coupled to decoders (not shown) coupled in turn to display devices (not shown). In operation, actuation of any key of the keyboard provides an output from NAND gate 256 which through pulse shaping circuit 257, driver 258, NAND gate 259 and inverter 260 provides an energizing pulse to an audible alarm; by this means, operation of any key is accompanied by an alarm bleep. The counter 250 is enabled in response to the pulse output of driver 258 and in response to its second count provides an output via NAND gates 261 and 262 to reset the latches 252, 253 and 254. At the third, fifth and seventh counts of counter 250 respectively the hundreds, tens and units latches are enabled and the value of the key first selected enters into latch 254. At the eighth count of counter 250, a long time constant monostable circuit 255 is enabled and provides an output to NAND gate 261 to inhibit further operation of the latches. At the ninth count of counter 250 its clock input is disabled, and when the selected key is released the counter 250 is reset to await depression of the next key. On selection and depression of the next key, this cycle is repeated though the still present output of monostable circuit 255 inhibits clearing of the latches 252, 253 and 254. The value entered into the units latch in the first cycle is shifted into the tens latch in the second cycle and the units latch takes up the value of the second-selected key. In the third cycle, a further shift between the units and tens latches and between the tens and hundreds latches occurs, thus setting up the desired pressure value in the three latches. Though not illustrated, a cancel key will be provided so that if the user makes an error when entering the desired pressure he can correct his entry.

Figure 8:
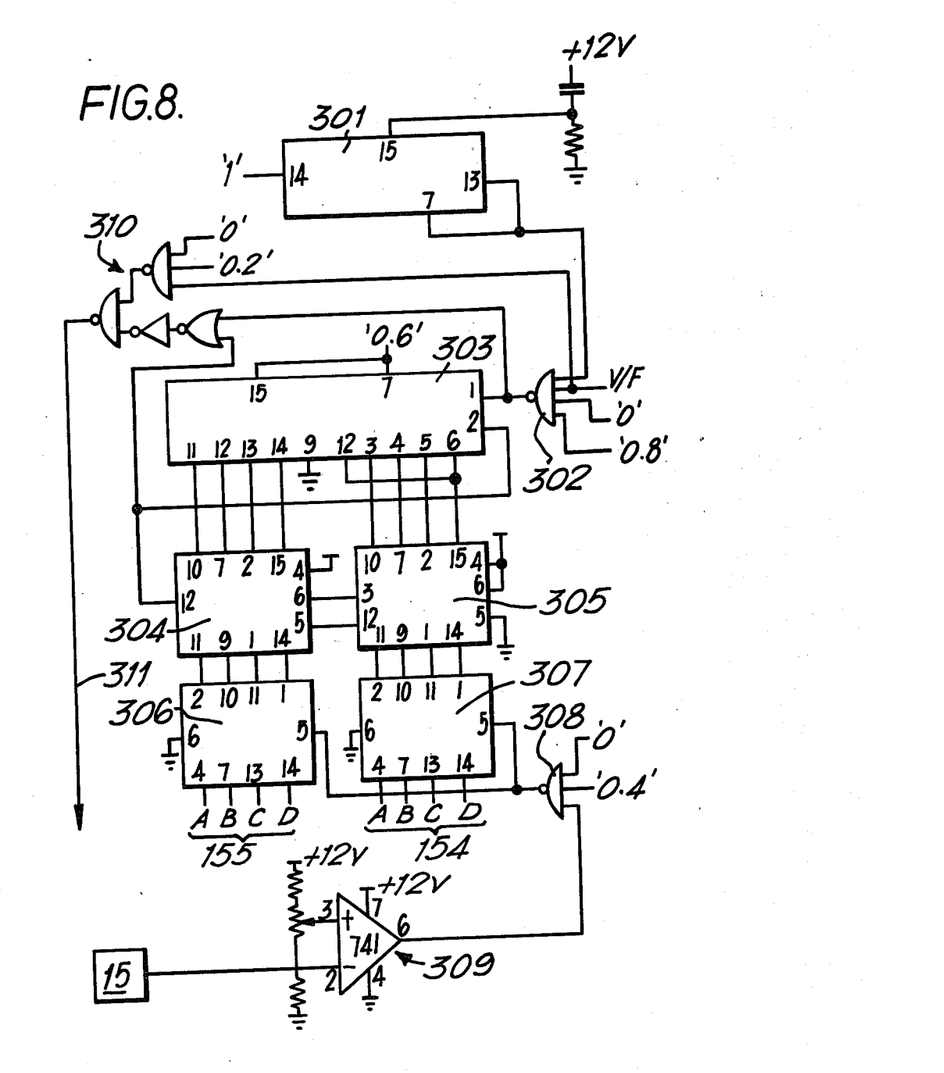
FIG. 8 shows the electrical circuit diagram of an optional auto-zero facility for incorporation into the second embodiment to compensate for transducer and/or voltage to frequency converter instability.

FIG. 8 of the drawings illustrates an auto-zero facility which may be incorporated into the system in order to provide automatic compensation for any tendency of the pressure transducer and/or the voltage-to-frequency converter to display instability or drift. It is however to be emphasized that no tendency for unacceptable drift to occur has been experienced in tests conducted on the embodiments hereinbefore described. The circuit shown in FIG. 8 is designed for incorporation into the second embodiment described herein and includes various inputs intended for connection to respective outputs of the main timers 164 and 165 shown in FIG. 6; these inputs are designated as shown by their enabled times in the cycle of main timers 164 and 165. As shown, the circuit of FIG. 8 includes a decade counter 301 which provides an output to a four-input NAND gate 302 which takes its other three inputs from the voltage to frequency converter 152 of FIG. 5 and from the "0" seconds and "0.8" seconds outputs of main timers 164 and 165. NAND gate 302 provides a gated input from the voltage/frequency converter 152 into dual decade counter 303 which provides outputs as shown to comparators 304 and 305 coupled in turn to quad latches 306 and 307 which provide inputs as shown for connection to the respective outputs of the units and tenths pressure counters 155 and 154 respectively of FIG. 5. An input from the pressure transducer is provided to NAND gate 308 via analogue comparator 309.

In operation of the auto-zero facility of FIG. 8 in conjunction with the second embodiment described hereinbefore, an auto-zero adjustment is effected in the first three timing cycles from switch-on of the apparatus with no tire connected. During this period no use can be made of the apparatus. The action of the auto-zero facility is dependent upon whether or not the transducer output voltage is below or above a preset nominal level determined by comparator 309. Taking the case where the output voltage of the transducer is below the preset level, at time 0.2 seconds as determined by the main timers 164, 165 the output of the voltage/frequency converter 152 is gated into the main counter stages 154, 155 via the gate circuitry shown at 310 and the line 311, at time 0.4 the count thus assembled is latched into the latches 306, 307 and at time 0.6 the main counters 154, 155 are cleared. When subsequently the apparatus is put to use and a tire is connected, at time 0.8 in the cycle time when the voltage/frequency converter output would normally be counted into the main counters 153 to 156 it is instead counted into counter 303 until the count therein is equal to that held by latches 306, 307 and only thereafter is it counted into the main counters 154, 155. The count held by latches 306, 307 thus provides a compensatory amount which is set against the pressure count entered during each cycle of the apparatus when it is in use. This amount compensates for the fact that the transducer output voltage with no tire connected was below its nominal base level. At time 1.6 in each inflation cycle the main counters and the counter 303 in the auto-zero circuit are cleared. In the case where the transducer output voltage with no tire connected is above its preset nominal level, the count taken from the voltage/frequency converter 152 before the tire is connected is not latched into the latches 306, 307 but is held in the main counters which, when a tire has been connected, thus already hold a compensatory count at time 0.8 when the voltage/frequency converter 152 provides its output to the main counters.

Yet a further modification of the second embodiment might comprise a modification of the deflation cycle, following attainment of a tire pressure greater than that required, in accordance with the level of the desired pressure such that irrespective of the desired pressure entered by the user the same or substantially the same pressure decrement results from each equivalent opening of the exhaust valve. By this means compensation would be effected for the fact that a lower pressure drop would occur were the exhaust valve opened for a set time at a pressure of 30 p.s.i., say, than would occur were the valve opened for the same time period with the pressure at 40 p.s.i., say. This modification might be effected by appropriate time gating of the exhaust valve operation in accordance with inputs from the pressure select mechanism such that, for example, different pressure selections would result in the deflation cycle times being correspondingly different; for the sake of clarity, the drawings do not illustrate this modification, but it will be appreciated that a simple gating circuit with timing inputs from the main timers 164, 165 and from the pressure select mechanism 131 and/or latch unit 134 would suffice to effect suitable adjustment of the exhaust valve operation.

A further modification might be effected in the inflation cycle so as to accommodate large tires, such as those of heavy trucks, which with the embodiments described, which are primarily intended for automobiles, would take perhaps an unduly long time to reach the required pressure. Such a modification might be desirable also in an apparatus according to the invention designed for inflating aircraft tires. The modification proposed is to sense the pressure increase obtained in consecutive inflation cycles and to adjust the inflation period by, say, up to 5 seconds correspondingly so as to obtain a set pressure increase, for example 2 p.s.i., during each inflation cycle. For the sake of clarity again, this modification is not illustrated in the drawings but could readily be obtained by storing the pressure measurement made in each inflation cycle, differencing the pressure measurement made in the next inflation cycle with the stored pressure measurement for the preceding cycle, and, if the pressure difference is less than or greater than the desired preset difference, generating a corresponding adjustment signal serving to increment or decrement the inflate time period by a predetermined amount by, for example, inhibiting the running of the main timer for the duration of the adjustment signal. In all other respects, the apparatus would operate as described.

The embodiment of FIGS. 4 to 6 could further be modified, and corresponding modifications could likewise be made to the first embodiment, so that, rather than deflating the tire for three seconds after the alarm has sounded to indicate that the required pressure has been attained and yet the tire has not been detached, instead a hold mode is entered to enable the tire to be disconnected at leisure with the audible alarm sounding continuously until the tire was disconnected. This would be achieved by providing alternative connections between gates 178 and 179, latch 214, gates 209 and 208, and gate 206, such that when the desired pressure is attained the valves remain closed, the alarm sounds, but nothing further occurs.

Various other modifications could clearly be made without departure from the spirit and scope of the invention and clearly it is not possible to discuss all of these. For example, a microprocessor based embodiment might be provided in which the timing and other logical functions were achieved by the programming of the microprocessor. Furthermore, whilst the invention has been particularly described in connection with apparatus for inflating tires, it is to be appreciated that the invention is not limited to this application. In the first embodiment, it was described that decoders and display devices were coupled to the pressure counters receiving the signal from the transducer via the voltage/frequency converter and it will be seen that such an arrangement constitutes an electronic pressure gauge having advantageous properties. An electronic pressure gauge embodiment of the invention would simply comprise the transducer, the voltage/frequency converter, the pressure counters, decoders, display means, and a simplified timing arrangement. Such an alternative clearly is not limited to the arrangement of the first embodiment. Furthermore, whilst in the described embodiments the control outlets serve for actuating air inlet and exhaust valves, it is clear that they could serve other purposes such as for example to control the fluid pressure in an hydraulic system. The transducer could, furthermore, be other than a pressure transducer and might alternatively be temperature responsive or weight responsive for example for adapting the system to a heating and/or ventilation/cooling application or a weighing/batching application respectively, such applications being mere illustrations of the wider application of the invention. In yet a further modification of the invention as hereinbefore described, rather than generating the timing signals by time division of the local a.c. mains frequency, a timing control unit based on a crystal (quartz) controlled oscillator might be utilized.

I claim:

1. A vehicle tire inflation system comprising:
   a pressure transducer adapted for connection to a vehicle tire to be responsive to the pressure therewithin for generating a corresponding output signal;
   converter means responsive to an output signal from said transducer for deriving a periodic signal having a frequency which is a function of the transducer output signal;

counter means coupled to the output of said converter means for counting excursions of the variable frequency signal produced thereby and providing output signals representative of the count accumulated;

time control means associated with said counter means for determining periods during which the output of said converter means is counted by said counter means whereby the count accumulated during each of said periods constitutes a measure of the transducer output during the respective period;

comparator means for comparing the count assembled in said counter means with a predetermined quantity representative of a desired tire pressure;

control means responsive to the result of said comparison for correspondingly adjusting the tire pressure; and the operations of said comparator means and of said control means being arranged to occur at times determined by said time control means.

2. A system as claimed in claim 1 further comprising display means adapted and arranged to provide a display of the count accumulated by the counter means during each of said time periods.

3. A system as claimed in claim 2 wherein said display means comprises decoder means responsive to the output signals of the counter means and at least one visible display means coupled to the decoder means and adapted to provide a visible display corresponding to the decoded output signals.

4. A system as claimed in claim 3 wherein said counter means comprises at least one decade counter providing BCD output signals, said display means comprises at least one seven-segment LCD display device, and said decoder means is adapted to convert the BCD output of the decade counter into a corresponding input for actuating the respective segments of the seven-segment LCD display.

5. A system according to claim 1 wherein said control means comprises at least an air inlet valve for admitting compressed air to the tire, and said time control means is adapted to generate a cyclic timing sequence during one part of each cycle of which a count is entered into the counter means so as to provide a measure therein of the transducer output and during another part of each cycle of which the air inlet valve is opened in dependence upon the comparison effected by said comparator means with the said predetermined quantity which is representative of a desired tire pressure.

6. A system according to claim 5 wherein each said cycle includes a period when the air inlet valve is not open and no count is entered into the counter means, said period enabling the system pressure to stabilize.

7. A system according to claim 5 or claim 6 wherein said comparator means is arranged to provide an output signal when the pressure sensed by the transducer is lower than the desired tire pressure by a preset amount or less, and logic circuitry is provided responsive to said output signal for decreasing the duration of that part of each cycle during which the air inlet valve is opened, the arrangement thus being such that a tire will be inflated by the system in cyclic periods of opening of said air inlet valve and said periods will have a first duration until the tire pressure is within a predeterined range of the desired tire pressure and thereafter will have a second, lesser duration.

8. A system according to claim 1 wherein said control means comprises an air inlet valve for admitting compressed air to the tire and an air exhaust valve for venting air from the tire, and said time control means is adapted to generate a cyclic timing sequence, and during one part of each cycle of said sequence a count is entered into the counter means so as to provide therein a measure of the transducer output, and during another part of each cycle of said sequence a respective one of said air inlet and exhaust valves is opened in dependence upon the comparison effected by said comparator means with the said predetermined quantity which is representative of a desired tire pressure, and wherein logic circuitry is provided responsive to outputs from said comparator means such that, in operation of the system, a tire to be inflated is subjected to timing cycles during each of which said air inlet valve is opened for a predetermined period until the pressure sensed by the transducer exceeds the desired tire pressure whereupon in succeeding cycles the exhaust valve is opened for a predetermined period until substantial equality of the sensed and desired pressures is achieved.

9. A system according to claim 8 wherein each opening of the exhaust valve is arranged to result in a smaller pressure change in the tire than that pressure change which results from each opening of the air inlet valve.

10. A system according to claim 7 or 8 wherein, in response to a comparator output during a deflation cycle indicative that the tire pressure is within a predetermined amount of the desired pressure, logic means cooperates with the time control means to reduce the period in each cycle during which the air exhaust valve is opened.

11. A system according to any of claims 5, 6, 8 or 9 including means responsive to the magnitude of the pressure increment occurring between successive inflation cycles for adjusting the open time of the air inlet valve in each cycle so as to obtain a substantially constant, predetermined pressure increment during each cycle at least for a first part of the inflation of the tire.

12. A system according to claim 8 or 9 including logic means responsive to the magnitude of said desired pressure for determining the open time of the exhaust valve in each deflation cycle such that, regardless of the magnitude of the desired pressure, a substantially constant, predetermined pressure decrement will be obtained by each opening of the exhaust valve at least for a first part of the deflation of the tire towards the desired pressure.

13. A system according to any of claims 5, 6, 8 or 9 including a desired pressure selection unit operable manually by a user for selecting a desired pressure to which a tire should be inflated, means responsive to said pressure selection unit for holding a representation of the selected desired pressure in the system and for providing corresponding signals to said comparator means, and display means for displaying a visible indication of the selected pressure.

14. A system according to any one of claims 1, 2, 3, 4, 5, 6, 8 or 9 further comprising compensating means for compensating for any tendency of the operating characteristics of the transducer and/or the converter means to demonstrate instability.

15. A system according to any one of claims 1, 2, 3, 4, 5, 6, 8 or 9 wherein said time control means comprises time division means arranged to operate upon the local a.c. mains supply frequency for deriving the requisite timing periods.

16. A tire inflation apparatus comprising:

an entry facility operable manually for recording in the apparatus a desired tire pressure to which in use of the apparatus a tire is to be inflated, said facility being arranged to provide output signals representative of a desired pressure entry;

an air pressure transducer arranged so as to be capable of being exposed to the air pressure of a tire when the apparatus is being used for inflating the said tire, the transducer providing an output signal proportional to the incident air pressure;

converter means coupled to the output of the transducer for generating a periodic output signal at a frequency which is a function of the transducer output;

a counter coupled to the output of the converter means and arranged for counting excursions of said periodic signal;

comparator means arranged so as to be responsive to the count held in the counter and to the output signals from the desired pressure entry facility for providing an indication as to the relationship between the tire pressure, as sensed by the transducer and translated by means of the converter means into a corresponding count held in the counter, and the desired tire pressure;

valve means arranged to be responsive to the indication provided by the comparator means for determining the inflation of the tire from a compressed air supply;

indicator means for providing an indication to a user when the comparator means senses that the pressure within the tire is the desired tire pressure; and timing control means controlling the operations of the counter means and the comparator means such that, in operation of the apparatus, a cyclic timing sequence is established during each cycle whereof the output of the converter means is gated into the counter for a first predetermined time period and during a second predetermined time period said valve means is controlled in dependence upon the count accumulated in the counter during said first time period.

* * * * *